US012619527B2

(12) United States Patent
Rana et al.

(10) Patent No.: US 12,619,527 B2
(45) Date of Patent: May 5, 2026

(54) MEMORY DEVICES INCLUDING LOGIC NON-VOLATILE MEMORY

(71) Applicant: MICRON TECHNOLOGY, INC., Boise, ID (US)

(72) Inventors: Vikas Rana, Pehowa (IN); Kalyan Chakravarthy Kavalipurapu, Telangana (IN)

(73) Assignee: Micron Technology, Inc., Boise, ID (US)

( * ) Notice: Subject to any disclaimer, the term of this patent is extended or adjusted under 35 U.S.C. 154(b) by 322 days.

(21) Appl. No.: 17/898,604

(22) Filed: Aug. 30, 2022

(65) Prior Publication Data

US 2024/0070059 A1     Feb. 29, 2024

(51) Int. Cl.
| | |
|---|---|
| *G06F 12/02* | (2006.01) |
| *G06F 11/10* | (2006.01) |
| *G11C 16/04* | (2006.01) |
| *G11C 16/08* | (2006.01) |
| *G11C 16/24* | (2006.01) |
| *G11C 16/26* | (2006.01) |

(52) U.S. Cl.
CPC ...... *G06F 12/0238* (2013.01); *G06F 11/1044* (2013.01); *G11C 16/0483* (2013.01); *G11C 16/08* (2013.01); *G11C 16/24* (2013.01); *G11C 16/26* (2013.01); *G06F 2212/202* (2013.01)

(58) Field of Classification Search
None
See application file for complete search history.

(56) References Cited

U.S. PATENT DOCUMENTS

| | | | | |
|---|---|---|---|---|
| 6,614,697 | B2 * | 9/2003 | Hogan | H04J 3/047 |
| | | | | 365/230.02 |
| 7,689,741 | B2 * | 3/2010 | Kang | G11C 7/1075 |
| | | | | 710/56 |
| 8,018,768 | B2 * | 9/2011 | Shih | G11C 14/0063 |
| | | | | 365/185.08 |
| 9,997,253 | B1 * | 6/2018 | Chen | G11C 11/5628 |
| 10,127,990 | B1 * | 11/2018 | Rana | G11C 16/0433 |
| 10,956,066 | B2 * | 3/2021 | Roohparvar | G06F 3/0685 |
| 11,073,897 | B2 * | 7/2021 | Rowley | G06F 1/26 |
| 2015/0095551 | A1 * | 4/2015 | Confalonieri | G11C 16/06 |
| | | | | 711/103 |

OTHER PUBLICATIONS

J. Raszka, et al., "Embedded Flash Memory for Security Applications in a 0.13μm CMOS Logic Process," ISSCC 2004, Sesson 2, Non-Volatile Memory 2.4, pp. 1-10.
K. Lee, et al., "Self-Convergent Scheme for Logic-Process-Based Multilevel/Analog Memory," IEEE Transactions on Electron Devices, vol. 52, No. 12, Dec. 2005, pp. 1-6.

(Continued)

*Primary Examiner* — Elias Mamo
(74) *Attorney, Agent, or Firm* — Dicke, Billig & Czaja, PLLC

(57) ABSTRACT

A memory device includes a first array of Non-Volatile Memory (NVM) cells, a second array of logic NVM cells, and a controller. The second array of logic NVM cells stores instructions for accessing the first array of NVM cells. The controller is configured to execute the instructions stored in the second array of logic NVM cells to perform access operations in the first array of NVM cells.

20 Claims, 10 Drawing Sheets

(56)                  References Cited

OTHER PUBLICATIONS

B. Wang, et al., "Charge Retention of Silicided and Unsilicided Floating Gates in Embedded Logic Nonvolatile Memory," IIRW Final Report 2005, pp. 1-4.
C. Kuo, et al., "Logic-Compatible Embedded NVM for RFID Application," Design Service Division, Taiwan Semiconductor Manufacturing Company, Ltd., pp. 1-2.
T. Lee, "A New Differential P-Channel Logic-Compatible Multiple-Time Programmable (MTP) Memory Cell With Self-Recovery Operation," IEEE Electron Device Letters, vol. 32, No. 5, May 2011, pp. 1-3.

* cited by examiner

MEMORY DEVICES INCLUDING LOGIC NON-VOLATILE MEMORY

TECHNICAL FIELD

The present disclosure relates generally to memory and, in particular, in one or more embodiments, the present disclosure relates to instruction logic non-volatile memory (NVM) within flash memory devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Flash memory may include ROM to store computer-readable executable instructions (e.g., firmware) for operating the flash memory. In addition, flash memory may include content-addressable memory (CAM) and static random access memory (SRAM) to store a limited set of firmware instructions that may be used to replace firmware instructions stored in the ROM.

DETAILED DESCRIPTION

Figure 1A:
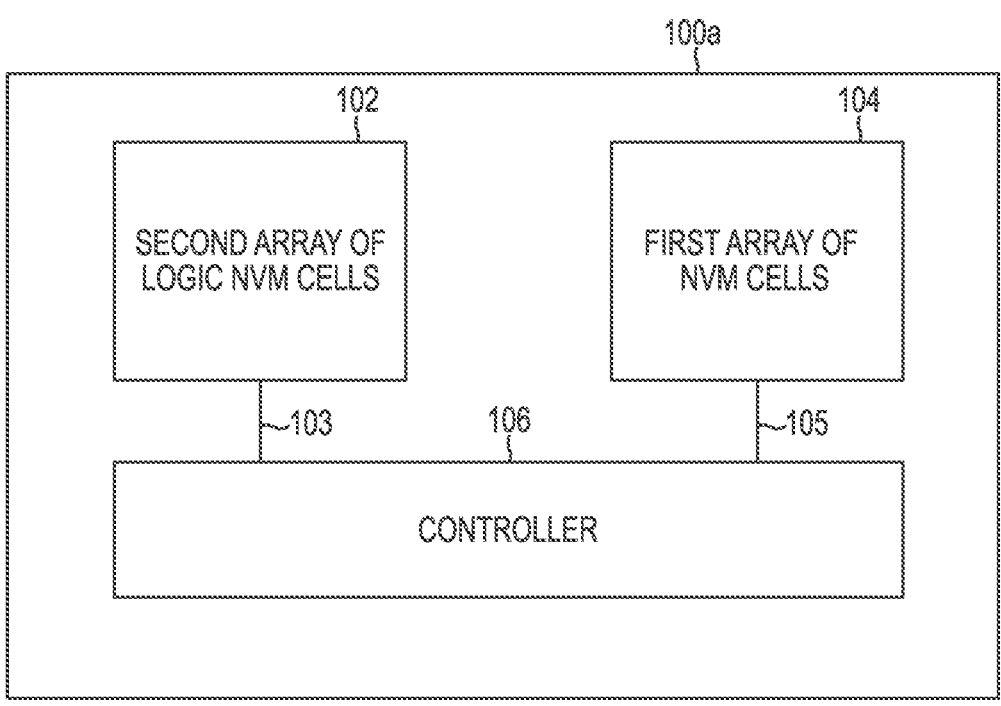
FIG. 1A is a simplified block diagram of a memory device according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by a conductive path unless otherwise apparent from the context.

Ranges might be expressed herein as from "about" one particular value, and/or to "about" another particular value. When such a range is expressed, another embodiment might include from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

In flash memory devices including read only memory (ROM) to store computer-readable executable instructions (e.g., firmware), flexibility is limited and there may be a long turnaround time if changes are needed to the firmware to fix bugs or to improve performance. Content-addressable memory (CAM) and static random access memory (SRAM) may be used to store a limited set of firmware instructions that may be used to replace firmware instructions stored in the ROM, but the capacity to support updates to the firmware after the ROM is programmed in silicon is typically small. In addition, SRAM is about ten times the size as ROM, thus SRAM has a relatively high cost compared to ROM. Logic non-volatile memory (NVM) is comparable in area to ROM, is smaller in area than SRAM, is comparable in performance compared to ROM and SRAM, and is easily updated.

Accordingly in some embodiments, disclosed herein are flash memory devices including embedded logic NVM cells, which are post-silicon programmable, to replace the instruction ROM, as well as the instruction CAM and the instruction SRAM, to store firmware instructions. In other embodiments, disclosed herein are flash memory devices including embedded logic NVM cells to replace the instruction SRAM, while the instruction ROM and instruction CAM remain. By using logic NVM, updates to the firmware instructions to fix bugs or to improve performance might be simplified compared to updating the firmware instructions in ROM.

FIG. 1A is a simplified block diagram of a memory device 100a according to an embodiment. Memory device 100a includes a first array of NVM cells 104, a second array of logic NVM cells 102, and a controller 106. The controller 106 is communicatively coupled to the second array of logic NVM cells 102 through a communication path 103 and to the first array of NVM cells 104 through a communication path 105. The second array of NVM cells 102 might store instructions for accessing the first array of NVM cells 104. The controller 106 might be configured to execute the instructions stored in the second array of logic NVM cells 102 to perform access operations (e.g., read and/or write operations and/or erase operations) in the first array of NVM cells 104.

In one example, the first array of NVM cells 104 might be an array of flash memory cells (e.g., a NAND memory array or a NOR memory array). Controller 106 might include a microcontroller, a control unit (CU), a central processing unit (CPU), or other suitable logic circuitry for loading and executing the instructions (e.g., firmware instructions) stored in the first array of NVM cells 102. The controller 106 might be configured to execute the instructions in response to address signals and control signals from an external host device as will be described below with reference to FIG. 2. The controller might also be configured to update the instructions stored in the second array of logic NVM cells 102 (e.g., to fix bugs and/or to improve performance). The embodiments described herein may also apply to memory devices with multiple controllers and multiple arrays of logic NVM cells. In such examples, the firmware instructions may be distributed (e.g., stored) across multiple arrays of logic NVM cells and the firmware instructions may be distributed (e.g., executed by) across multiple controllers.

Figure 1B:
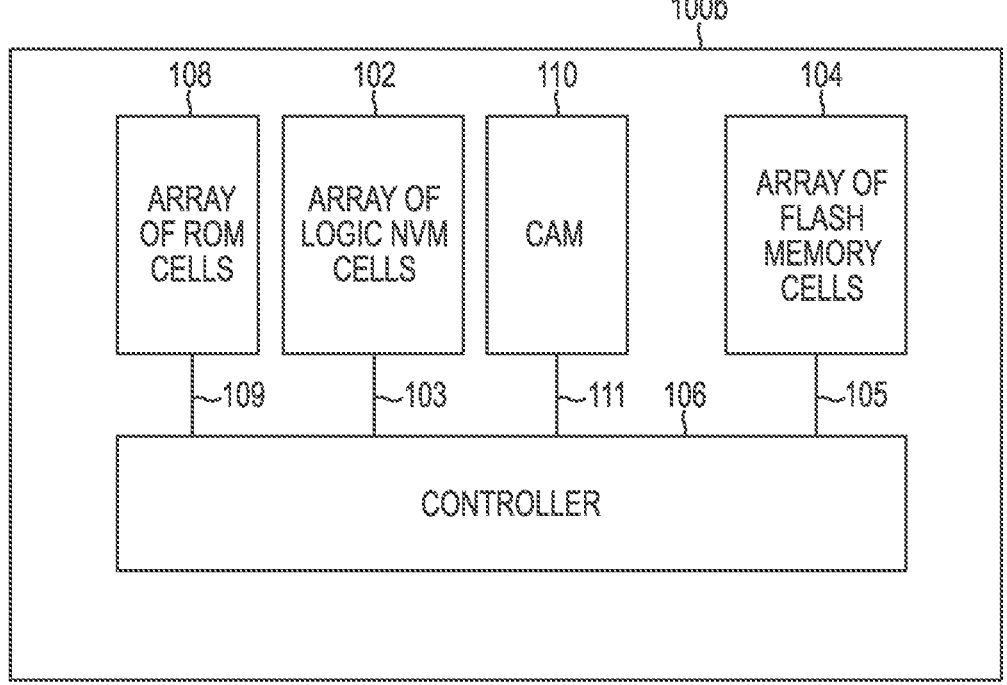
FIG. 1B is a simplified block diagram of another memory device according to an embodiment.

FIG. 1B is a simplified block diagram illustrating another memory device 100b according to an embodiment. Memory device 100b includes an array of logic NVM cells 102 (e.g., second array of logic NVM cells 102 of FIG. 1A), an array of flash memory cells 104 (e.g., first array of NVM cells 104 of FIG. 1A), and a controller 106. In addition, memory device 100b includes an array of ROM cells 108 and a CAM 110. The controller 106 is communicatively coupled to the array of ROM cells 108 through a communication path 109 and to the CAM 110 through a communication path 111. In this embodiment, the array of ROM cells 108 might store instructions for accessing the array of flash memory cells 104, and the array of logic NVM cells 102 might store updated instructions for accessing the array of flash memory cells 104. The CAM 110 might store addresses indicating which instructions stored in the array of ROM cells 108 include corresponding updated instructions stored in the array of logic NVM cells 102. The controller 106 might be configured to execute the instructions stored in the array of ROM cells 108 and/or the updated instructions stored in the array of logic NVM cells 102 (e.g., based on the addresses stored in the CAM 110) to perform an access operation (e.g., a read and/or write operation and/or an erase operation) in the array of flash memory cells 104.

Figure 2:
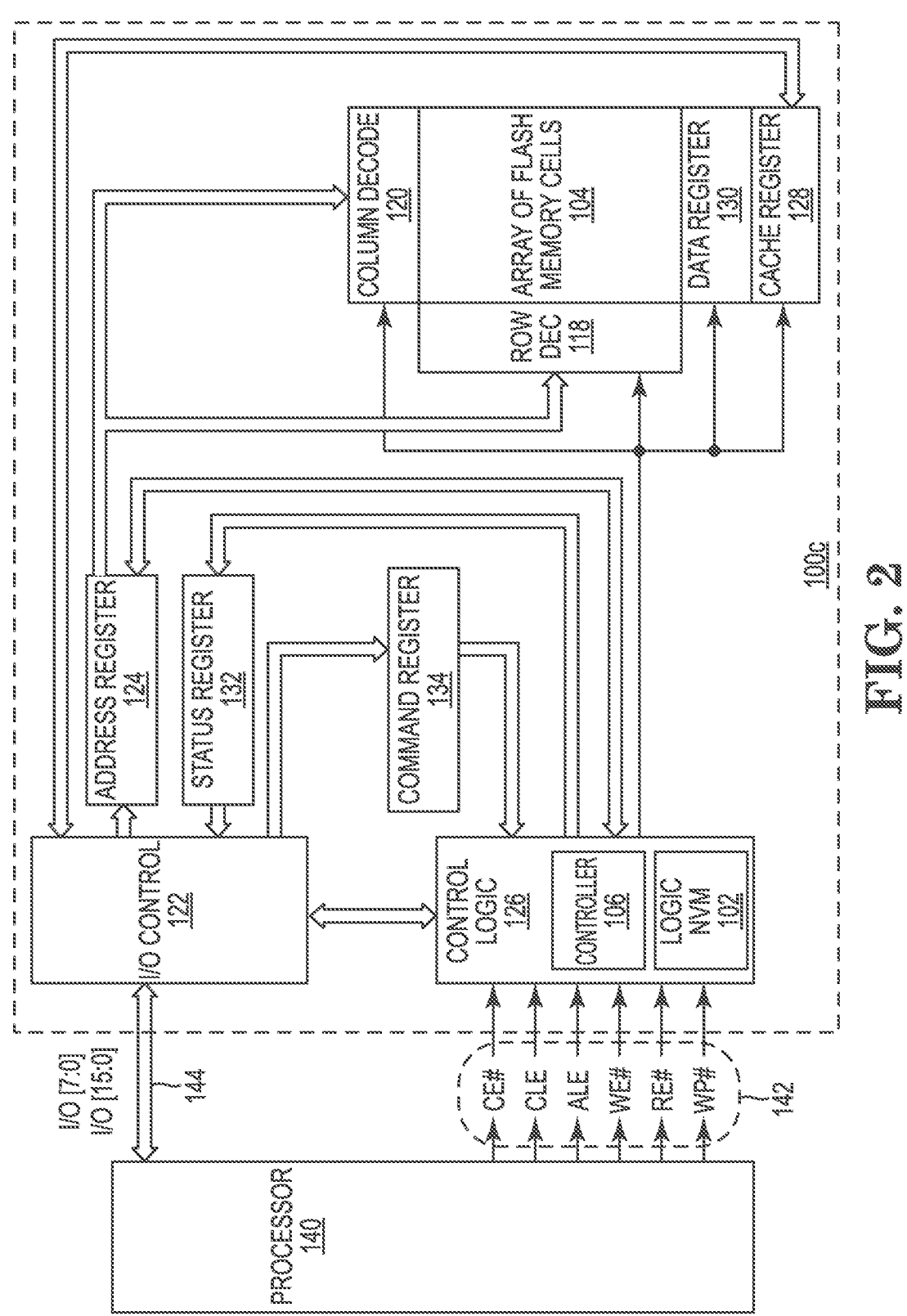
FIG. 2 is a simplified block diagram of a memory in communication with a processor as part of an electronic system, according to an embodiment.

FIG. 2 is a simplified block diagram of a first apparatus, in the form of a memory (e.g., memory device) 100c, in communication with a second apparatus, in the form of a processor 140, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 140, e.g., a controller external to the memory device 100c, might be a memory controller or other external host device.

Memory device 100c includes an array of flash memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of the array of flash memory cells 104 are capable of being programmed to one of at least two target data states.

A row decode circuitry 118 and a column decode circuitry 120 are provided to decode address signals. Address signals are received and decoded to access the array of flash memory cells 104. Memory device 100c also includes input/output (I/O) control circuitry 122 to manage input of commands, addresses and data to the memory device 100c as well as output of data and status information from the memory device 100c. An address register 124 is in communication with I/O control circuitry 122 and row decode circuitry 118 and column decode circuitry 120 to latch the address signals prior to decoding. A command register 134 is in communication with I/O control circuitry 122 and control logic 126 to latch incoming commands.

A controller 106 of the control logic 126 internal to the memory device 100c controls access to the array of flash memory cells 104 in response to the commands and may generate status information for the external processor 140, i.e., control logic 126 is configured to perform access operations (e.g., sensing operations [which might include read operations and verify operations], programming operations and/or erase operations) on the array of flash memory cells 104. The control logic 126 is in communication with row decode circuitry 118 and column decode circuitry 120 to control the row decode circuitry 118 and column decode circuitry 120 in response to the addresses. The control logic 126 might include a logic NVM 102, which might represent computer-usable memory for storing computer-readable instructions. For some embodiments, the logic NVM 102 might store firmware.

Control logic 126 might also be in communication with a cache register 128. Cache register 128 latches data, either incoming or outgoing, as directed by control logic 126 to temporarily store data while the array of flash memory cells 104 is busy writing or reading, respectively, other data. During a programming operation (e.g., write operation), data might be passed from the cache register 128 to the data register 130 for transfer to the array of flash memory cells 104; then new data might be latched in the cache register 128 from the I/O control circuitry 122. During a read operation, data might be passed from the cache register 128 to the I/O control circuitry 122 for output to the external processor 140; then new data might be passed from the data register 130 to the cache register 128. The cache register 128 and/or the data register 130 might form (e.g., might form a portion of) a page buffer of the memory device 100c. A page buffer might further include sensing devices (not shown in FIG. 2) to sense a data state of a memory cell of the array of flash memory cells 104, e.g., by sensing a state of a data line connected to that memory cell. A status register 132 might be in communication with I/O control circuitry 122 and control logic 126 to latch the status information for output to the processor 140.

Memory device 100c receives control signals at control logic 126 from processor 140 over a control link 142. The control signals might include a chip enable CE #, a command latch enable CLE, an address latch enable ALE, a write enable WE #, a read enable RE #, and a write protect WP #. Additional or alternative control signals (not shown) might be further received over control link 142 depending upon the nature of the memory device 100c. Memory device 100c receives command signals (which represent commands), address signals (which represent addresses), and data signals (which represent data) from processor 140 over a multiplexed input/output (I/O) bus 144 and outputs data to processor 140 over I/O bus 144.

For example, the commands might be received over input/output (I/O) pins [7:0] of I/O bus 144 at I/O control circuitry 122 and might then be written into command register 134. The addresses might be received over input/output (I/O) pins [7:0] of I/O bus 144 at I/O control circuitry 122 and might then be written into address register 124. The data might be received over input/output (I/O) pins [7:0] for an 8-bit device or input/output (I/O) pins [15:0] for a 16-bit device at I/O control circuitry 122 and then might be written into cache register 128. The data might be subsequently written into data register 130 for programming the array of flash memory cells 104. For another embodiment, cache register 128 might be omitted, and the data might be written directly into data register 130. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100c by an external device (e.g., processor 140), such as conductive pads or conductive bumps as are commonly used.

It will be appreciated by those skilled in the art that additional circuitry and signals can be provided, and that the memory device 100c of FIG. 2 has been simplified. It should be recognized that the functionality of the various block components described with reference to FIG. 2 might not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) might be used in the various embodiments.

Figure 3:
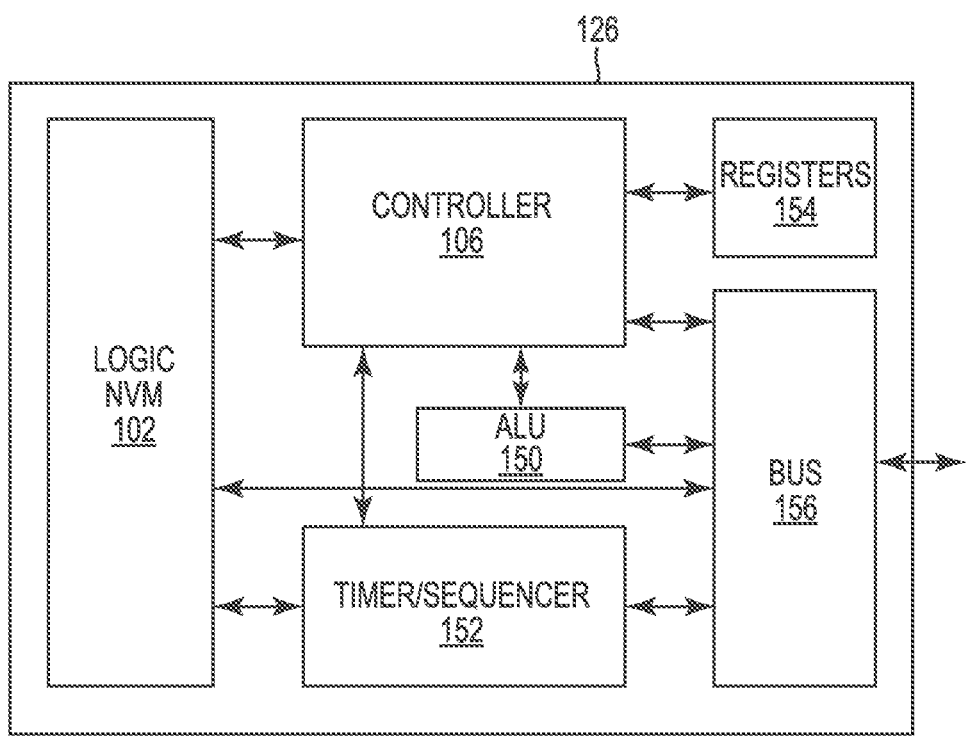
FIG. 3 is a simplified block diagram of control logic including a logic non-volatile memory (NVM), according to an embodiment.

FIG. 3 is a simplified block diagram of control logic 126 including logic NVM 102 and controller 106, according to an embodiment. Control logic 126 might also include an arithmetic logic unit (ALU) 150, a timer/sequencer 152, registers 154, and a bus 156. Controller 106 (e.g., a CPU, such as a processor/co-processor) might be used to encode/decode addresses and instructions and execute the instructions to perform memory operations. Controller 106 is in communication with the logic NVM 102 to read the instructions (e.g., firmware) stored in the logic NVM to be executed to perform memory operations in response to requests (e.g., read, write, or erase requests) from an external host device. Controller 106 may also update the instructions stored in the logic NVM 102 in response to a request to update the instructions from an external host device.

Controller 106 is in communication with ALU 150, which might perform all arithmetic and/or logical operations on data during the execution of the instructions during memory operations. Timer/sequencer 152 is in communication with logic NVM 102, controller 106, and bus 156, and might control the sequence of the memory operations and the timing of signals according to a global clock. Controller 106 is also in communication with registers 154, which might be used to temporarily store addresses and/or data during memory operations. Bus 156 is in communication with controller 106, ALU 150, logic NVM 102, and timer/sequencer 152, and might include a plurality of signal lines where address, data, and/or control signals are carried in and/or out of control unit 126 for processing. For example, bus 156 might carry address, data, and/or control signals between control logic 126 and processor 140, I/O control circuitry 122, command register 134, status register 132, address register 124, column decoder 120, row decoder 118, data register 130, and/or cache register 128 of FIG. 2.

Figure 4A:
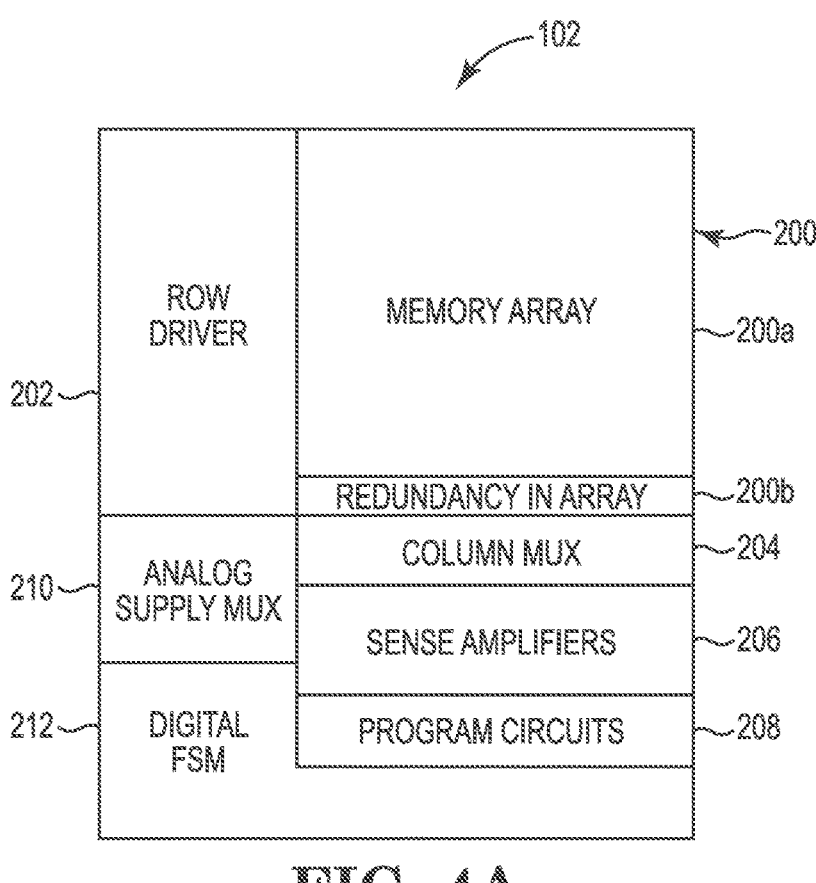
FIGS. 4A and 4B are block diagrams of a logic NVM according to an embodiment.

FIG. 4A is a block diagram of a logic NVM 102, according to an embodiment. Logic NVM 102 includes a memory array 200 of logic NVM cells, a row driver 202, a column multiplexer (MUX) 204, sense amplifiers 206, program circuits 208, an analog supply MUX 210, and a digital finite state machine (FSM) 212. Memory array 200 includes an array of logic NVM cells (e.g., as described below with reference to FIG. 8) that might be logically arranged in rows and columns. Logic NVM cells of a logical row might be connected to the same access line (commonly referred to as word line) while memory cells of a logical column might be connected to the same data line (commonly referred to as a bit line). Logic NVM cells are capable of being programmed to one of at least two target data states. Memory array 200 might include a main portion 200a and a redundant portion 200b including a predetermined percentage (e.g., 10%) of redundant memory cells. The redundant memory cells of redundant portion 200b may be used in place of defective and/or failed memory cells within the main portion 200a.

Row driver 202 and column MUX 204 are provided to decode address signals. The row driver 202 is connected to the word lines of the memory array 200, and the column MUX is connected to the bit lines of the memory array 200. Sense amplifiers 206 are connected to the column MUX 204 for reading data stored in the memory array 200. Program circuits 208 are connected to the column MUX 204 for writing data to the memory array 200. Analog supply MUX 210 might selectively apply voltages to the word lines and bit lines (and other signal lines, such as select lines and/or source lines) of the memory array 200 to perform access operations (e.g., read operations, programming operations, and/or erase operations) in the memory array.

Digital FSM 212 is configured to control operations of the logic NVM 102. In some examples, digital FSM 212 might be configured to execute a single error correction/double error detection error correction code (ECC). In other examples, digital FSM 212 might be configured to execute a double error correction/triple error detection ECC. Digital FSM 212 controls access to memory array 200 in response to the command and address signals from a controller (e.g., 106). The digital FSM 212 is in communication with row driver 202 and column MUX 204 to control the row driver 202 and column MUX 204 in response to address signals.

Digital FSM 212 might also be in communication with program circuits 208. Program circuits 208 might latch data, either incoming or outgoing, as directed by digital FSM 212 to temporarily store data while the memory array 200 is busy writing or reading, respectively, other data. Sense amplifiers 206 might sense a data state of a memory cell of the memory array 200, e.g., by sensing a state of a bit line connected to that memory cell. During a programming operation (e.g., write operation), data might be passed from the program circuits 208 to the column MUX 204 for transfer to the memory array 200; then new data might be latched in the sense amplifiers 206. During a read operation, data might be passed from the sense amplifiers 206 to the digital FSM 212 for output to an external processor (e.g., controller 106); then new data might be passed from the digital FSM 212 to the program circuits 208 to column MUX 204 and finally to memory array 200. The sense amplifiers 206 and/or the program circuits 208 might form (e.g., might form a portion of) a page buffer of the logic NVM 102.

Figure 4B:
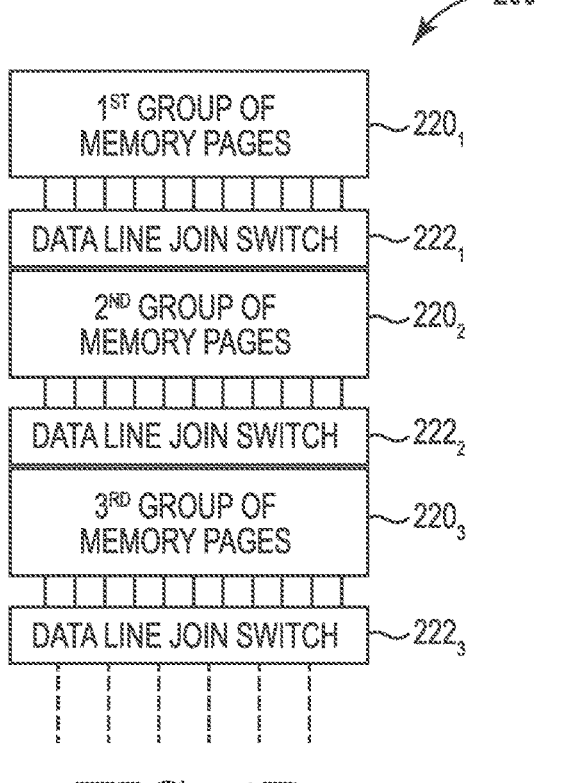

FIG. 4B is a block diagram of memory array 200 according to an embodiment. Memory array 200 might include a plurality of groups of memory cells 220₁, 220₂, 220₃, etc. and a plurality of data line join switches 222₁, 222₂, 222₃, etc. to selectively connect a respective group of the plurality of groups of memory cells to a plurality of data lines. Each group of memory cells 220₁, 220₂, 220₃, etc. might include a group of memory pages. By grouping a certain number of memory pages with a data line join switch, the data line resistance/capacitance (RC) may be reduced, which might improve read timing. By using the data line join switches, only a specific group of memory pages can be selected, while the remaining groups of memory pages are bypassed, thereby significantly reducing the data line RC.

Figure 5:
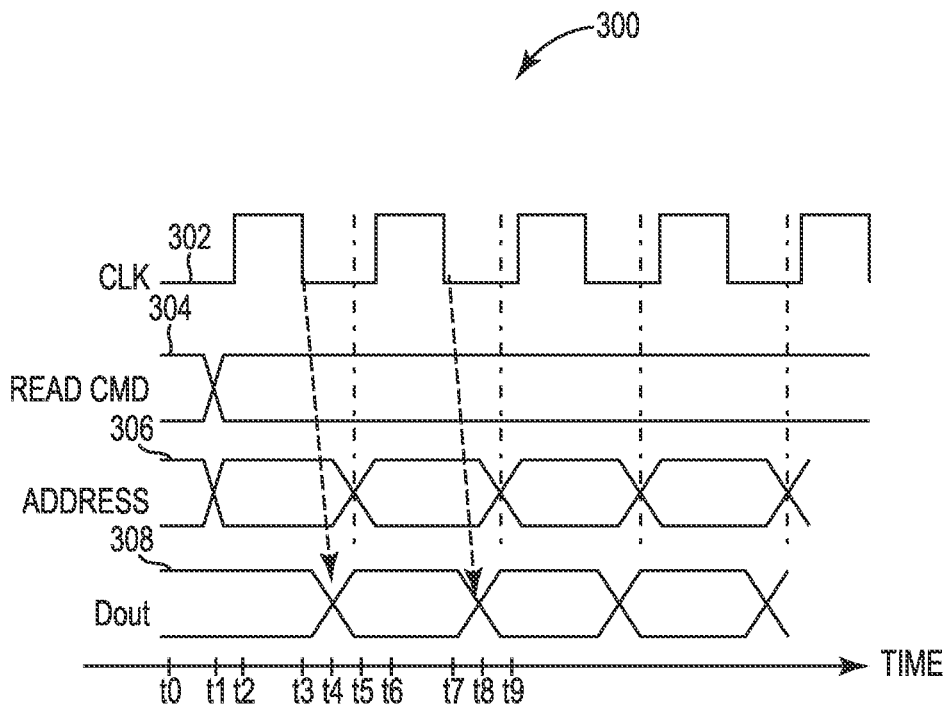
FIG. 5 is a timing diagram of a logic NVM read protocol according to an embodiment.

FIG. 5 is a timing diagram 300 of a logic NVM read protocol, according to an embodiment. Timing diagram 300 includes a clock signal 302 (e.g., from timer/sequencer 152 of FIG. 3 to digital FSM 212 of FIG. 4A), a read command signal 304 (e.g., from controller 106 of FIG. 3 to digital FSM 212), an address signal 306 (e.g., from controller 106 to digital FSM 212), and a data out signal 308 (e.g., from digital FSM 212 to controller 106). At time to, the logic NVM is idle or completing a previous operation. At time t1, the logic NVM receives a read command and a first address. At time t2, in response to the rising edge of the clock signal, the logic NVM detects the read command and the first address and reads the data stored in the array of logic NVM cells (e.g., in memory array 200 of FIG. 4A) at the first address. In response to the falling edge of the clock signal at time t3, the data for the first address is output on the data out signal at time t4. At time t5, the logic NVM receives a second address. At time t6, in response to the rising edge of the clock signal, the logic NVM reads the data stored in the array of logic NVM cells at the second address. In response to the falling edge of the clock signal at time t7, the data for the second address is output on the data out signal at time t8. At time t9, the logic NVM receives a third address and the process continues until the data for each received address is output.

Figure 6A:
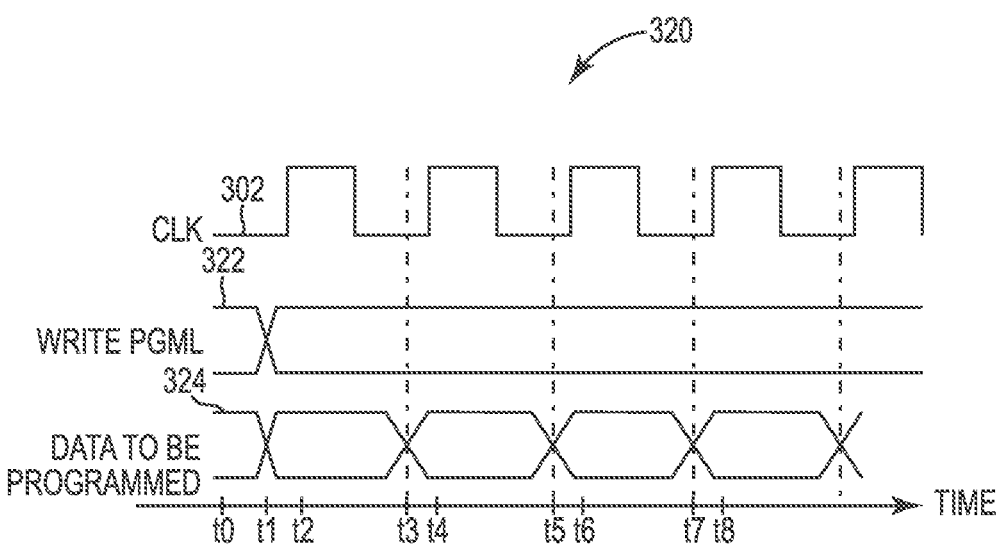
FIGS. 6A and 6B are timing diagrams of a logic NVM write protocol according to an embodiment.
Figure 6B:
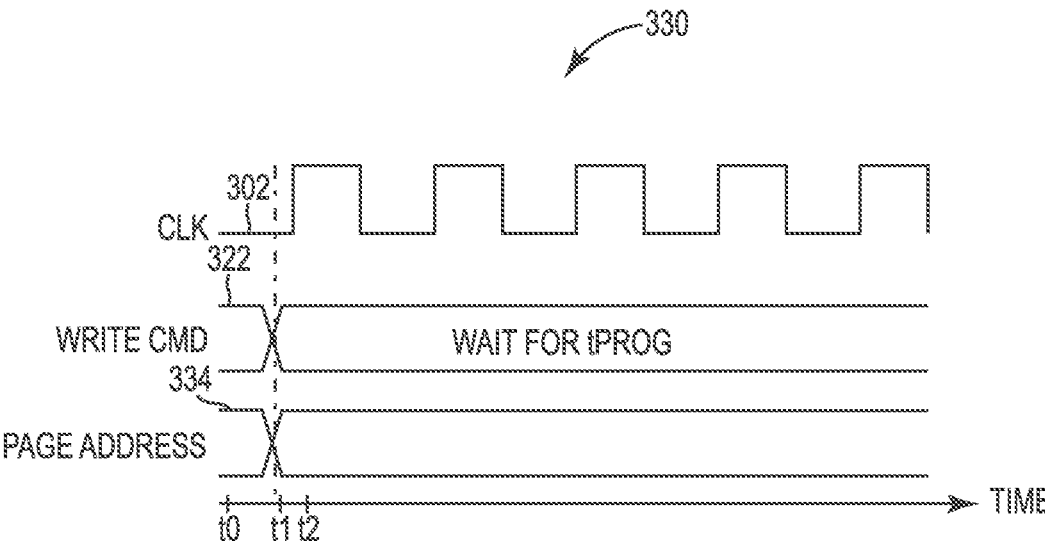

FIGS. 6A and 6B are timing diagrams of a logic NVM write protocol, according to an embodiment. FIG. 6A is a timing diagram 320 of a first step of a two step process for writing data to the logic NVM. Timing diagram 320 includes a clock signal 302, a write program data command signal 322 (e.g., from controller 106 to digital FSM 212), and a data signal 324 (e.g., from controller 106 to digital FSM 212) for the data to be programmed. At time to, the logic NVM is idle or completing a previous operation. At time t1, the logic NVM receives a write program data command and first data to be programmed. At time t2, in response to the rising (or falling) edge of the clock signal, the first data is latched in the logic NVM (e.g., within program circuits 208 of FIG. 4A). At time t3, second data to be programmed is received, and at time t4, in response to the rising (or falling) edge of the clock signal, the second data is latched in the logic NVM. At time t5, third data to be programmed is received, and at time t6, in response to the rising (or falling) edge of the clock signal, the third data is latched in the logic NVM. Likewise, at time t7, fourth data to be programmed is received, and at time t8, in response to the rising (or falling) edge of the clock signal, the fourth data is latched in the logic NVM. Additional data may be received and latched.

FIG. 6B is a timing diagram 330 of the second step of the two step process for writing data to the logic NVM. Timing diagram 330 includes the clock signal 302, a write command signal 322, and a page address signal 334. At time t0, the logic NVM has completed the first step of the two step process as previously described and illustrated with reference to FIG. 6A. At time t1, the logic NVM (e.g., digital FSM 212) issues an internal write command and a page address (e.g., to row driver 202, column MUX 204, and program circuits 208) to write the data stored in the latches to the array of logic NVM cells (e.g., memory array 200). At time t2, the logic NVM waits a program time (tPROG) for the writing of the data to the array of logic NVM cells to complete.

Figure 7A:
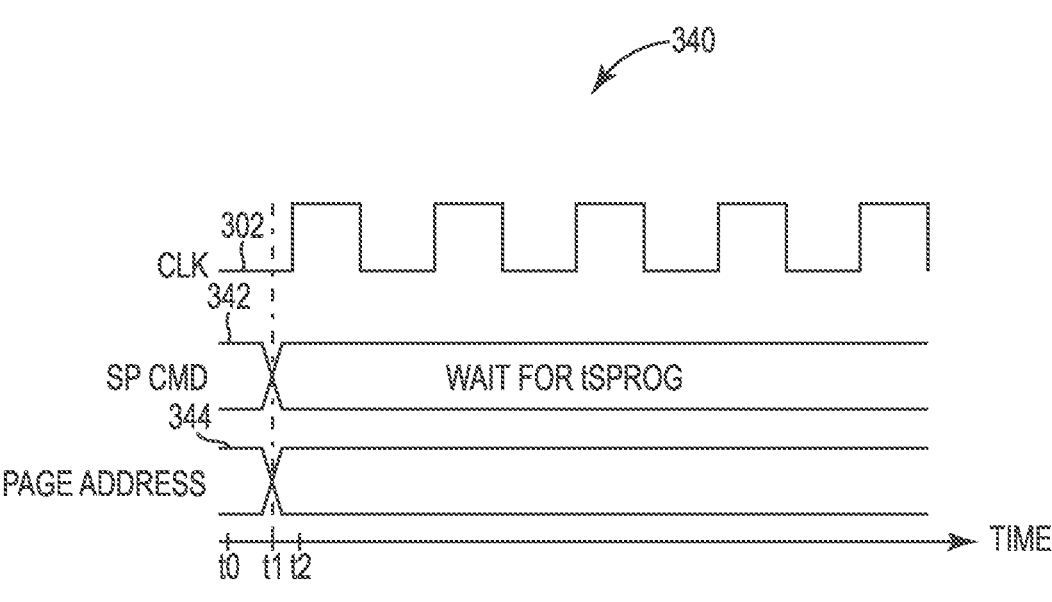
FIGS. 7A and 7B are timing diagrams of a logic NVM erase protocol according to an embodiment.
Figure 7B:
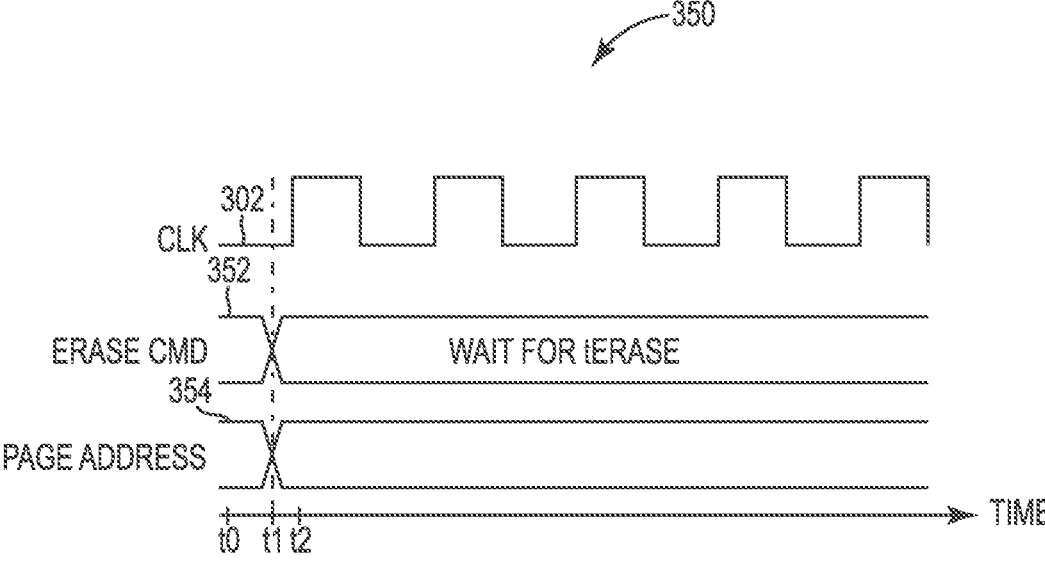

FIGS. 7A and 7B are timing diagrams of a logic NVM erase protocol, according to an embodiment. FIG. 7A is a timing diagram 340 of a first step of a two step process for erasing data stored within the logic NVM. Timing diagram 340 includes a clock signal 302, a soft program command signal 342, and a page address signal 344. At time to, the logic NVM is idle or completing a previous operation. At time t1, the logic NVM (e.g., digital FSM 212) issues an internal soft program command and a page address (e.g., to row driver 202, column MUX 204, and program circuits 208) to soft program the logic NVM cells of the selected page of the array of logic NVM cells (e.g., memory array 200). At time t2, the logic NVM waits a soft program time (tSPROG) to bring the memory cells of the selected page in the array of logic NVM cells to the same level.

FIG. 7B is a timing diagram 350 of the second step of the two step process for erasing data stored within the logic NVM. Timing diagram 350 includes the clock signal 302, an erase command signal 352, and a page address signal 354. At time t0, the logic NVM has completed the first step of the two step process as previously described and illustrated with reference to FIG. 7A. At time t1, the logic NVM (e.g., digital FSM 212) issues an internal erase command and a page address (e.g., to row driver 202, column MUX 204, and program circuits 208) to erase the data stored in the selected page of the array of logic NVM cells (e.g., memory array 200). At time t2, the logic NVM waits an erase time (tERASE) for the erasing of the data in the selected page of the array of logic NVM cells to complete.

Figure 8:
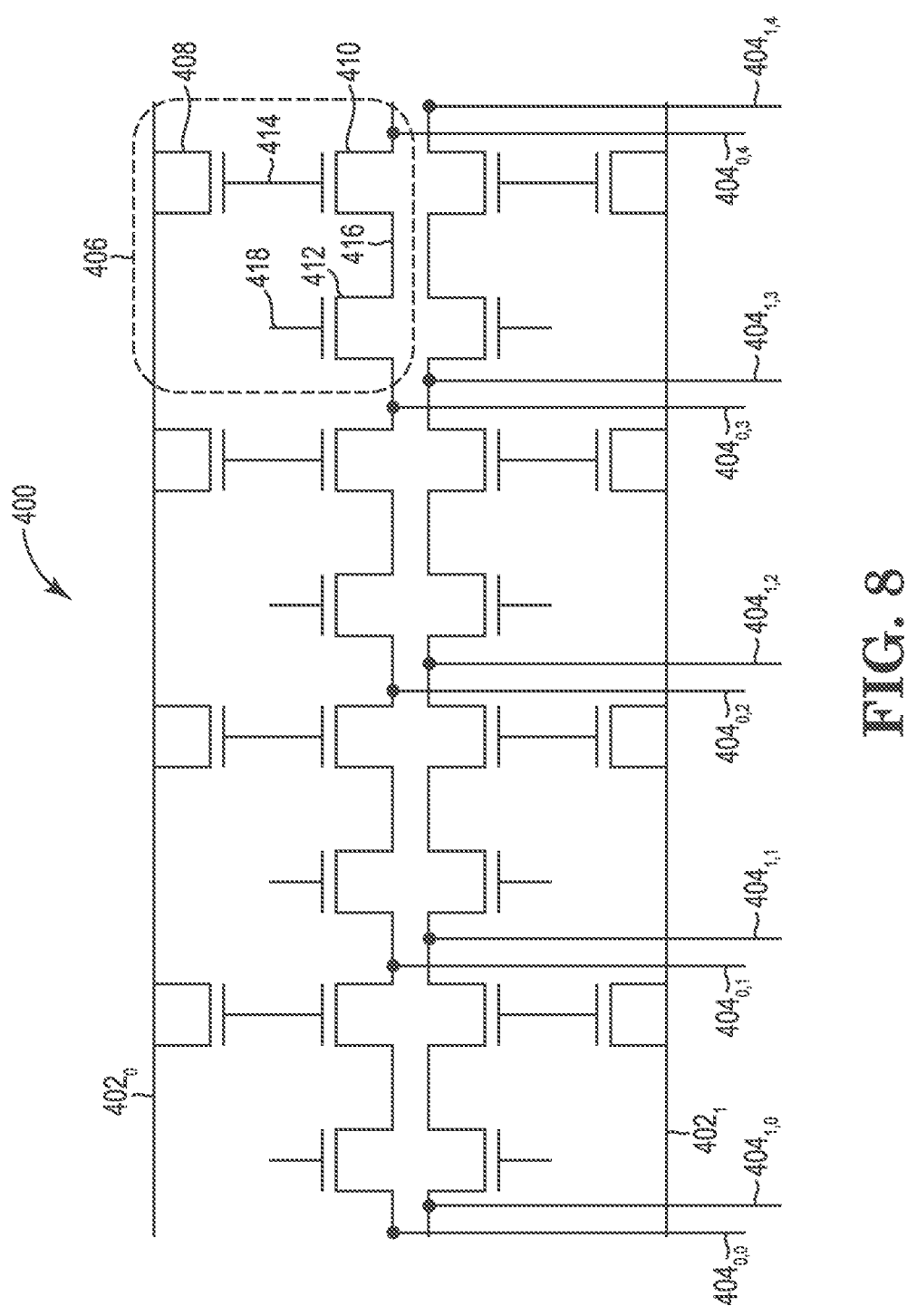
FIG. 8 is a schematic diagram of an array of logic NVM cells according to an embodiment.

FIG. 8 is a schematic diagram of a portion of an array 400 of logic NVM cells, according to an embodiment. Array 400 of logic NVM cells includes a plurality of access lines 402 commonly referred to as word lines, a plurality of data lines 404 commonly referred to as bit lines, and a plurality of logic NVM cells 406. The portion of the array 400 shown in FIG. 8 includes access lines $402o$ and $4021$ corresponding to a first page of memory cells and a second page of memory cells, respectively. The portion of the array 400 also includes data lines $404_{0,0}$ to $404_{0,4}$ connected to respective memory cells 406 of the first page of memory cells, and data lines $404_{1,0}$ to $404_{1,4}$ connected to respective memory cells 406 of the second page of memory cells.

In some examples, a single instruction is stored in each page of the array 400 of logic NVM cells. By storing a single instruction in each page, program disturb within the array 400 may be avoided. The array 400 of logic NVM cells may be arranged in different ways to meet specific read specifications for different applications.

Each memory cell 406 includes a first transistor 408 (e.g., NMOS transistor), a second transistor 410 (e.g., NMOS transistor), and a third transistor 412 (e.g., NMOS transistor). The source and drain of the first transistor 408 are connected to a corresponding word line 402 (e.g., $402_0$), such that the first transistor 408 acts as a capacitor. The gate of the first transistor 408 is directly connected to the gate of the second transistor 410 to form a floating gate as indicated at 414, such that the second transistor 410 acts as a data storage device. One side of the source-drain path of the second transistor 410 is connected to a corresponding data line 404 (e.g., $404_{0,4}$) and one side of the source-drain path of the third transistor 412 of the adjacent memory cell, and the other side of the source-drain path of the second transistor 410 is connected to one side of the source-drain path of the third transistor 412 as indicated at 416. The other side of the source-drain path of the third transistor 412 is connected to the second transistor 410 of the adjacent memory cell and the corresponding data line 404 (e.g., $404_{0,3}$) of the adjacent memory cell. The gate of the third transistor 412 is connected to a corresponding select line 418.

Each of the first transistor 408, second transistor 410, and the third transistor 412 might have the same gate oxide. The floating gate 414 is used to trap or de-trap electrons during program and erase operations, respectively. The third transistor 412 is a select transistor placed in series with the second transistor 410 to select and deselect the second transistor for different memory operations. In some examples, array 400 of logic NVM cells might have a program/erase endurance of up to 1000 cycles and 10 years of retention capability at a temperature of 125° C.

Logic NVM cells 406 are based upon the Fowler Nordheim (FN) tunneling effect to write data and erase data to and from the memory cells. During a program operation, an electric field is applied in such a way that electrons from the channel of the second transistor 410 tunnel towards the floating gate 414 and the threshold voltage of the second transistor 410 increases. During a program operation of a selected memory cell 406, a program voltage ($V_{PGM}$) might be applied to the corresponding word line (e.g., $402_0$) for the selected memory cell, a common or ground voltage (e.g., 0V) might be applied to all the select lines 418 of the memory cells corresponding to the word line for the selected memory cell, a common or ground voltage might be applied to the bit line (e.g., $404_{0,4}$) corresponding to the selected memory cell, and an inhibit voltage ($V_{INHIBIT}$) might be applied to the bit lines corresponding to the unselected memory cells. The program voltage is selected such that the voltage at the floating gate 414 of the selected memory cell 406 is sufficient to cause FN-tunneling effect. Based upon the type of gate oxide and the thickness of the gate oxide, the program voltage may be determined. For example, for low voltage devices with an about 7 nm gate oxide thickness, with a program voltage of about 10.8V, an inhibit voltage of about 3.6V is sufficient to inhibit the programming of unselected memory cells. In this way, none of the junctions/nodes except the tunnel oxide is subject to safe operating area (SOA) violations.

During an erase operation of memory cells 406, a reverse electric field is applied such that electrons from the floating gate 414 tunnel towards the bulk which depletes the floating gate and the threshold voltage of the second transistor 410 is reduced. Erase operations are performed on pages of logic NVM cells 406 connected to the same word line 402. During an erase operation, the word line 402 for the selected page might be biased to a common or ground voltage, the bit lines 404 might be floated, and the bulk and the select lines 418 might be biased to an erase voltage ($V_{ERASE}$) (e.g., about 15V).

During a read operation of a selected memory cell 406, a read voltage ($V_{READ}$) might be applied to the word line 402 for the selected memory cell, a supply voltage (e.g., $V_{cc}$) might be applied to the select line 418 of the selected memory cell, and a bit line voltage ($V_{BL}$) might be applied to the bit line 404 corresponding to the selected memory cell. $V_{READ}$ might equal $(V_{ERASE}+V_{PGM})/2$, such that the read voltage is in the middle of the threshold voltage of an erased memory cell and the threshold voltage of a programmed memory cell. The bit line voltage might be a cascaded voltage generated in such a way that the voltage does not cause read disturb in the selected memory cell. In some examples, the bit line voltage might be between about 0.5V and about 1V.

Figure 9:
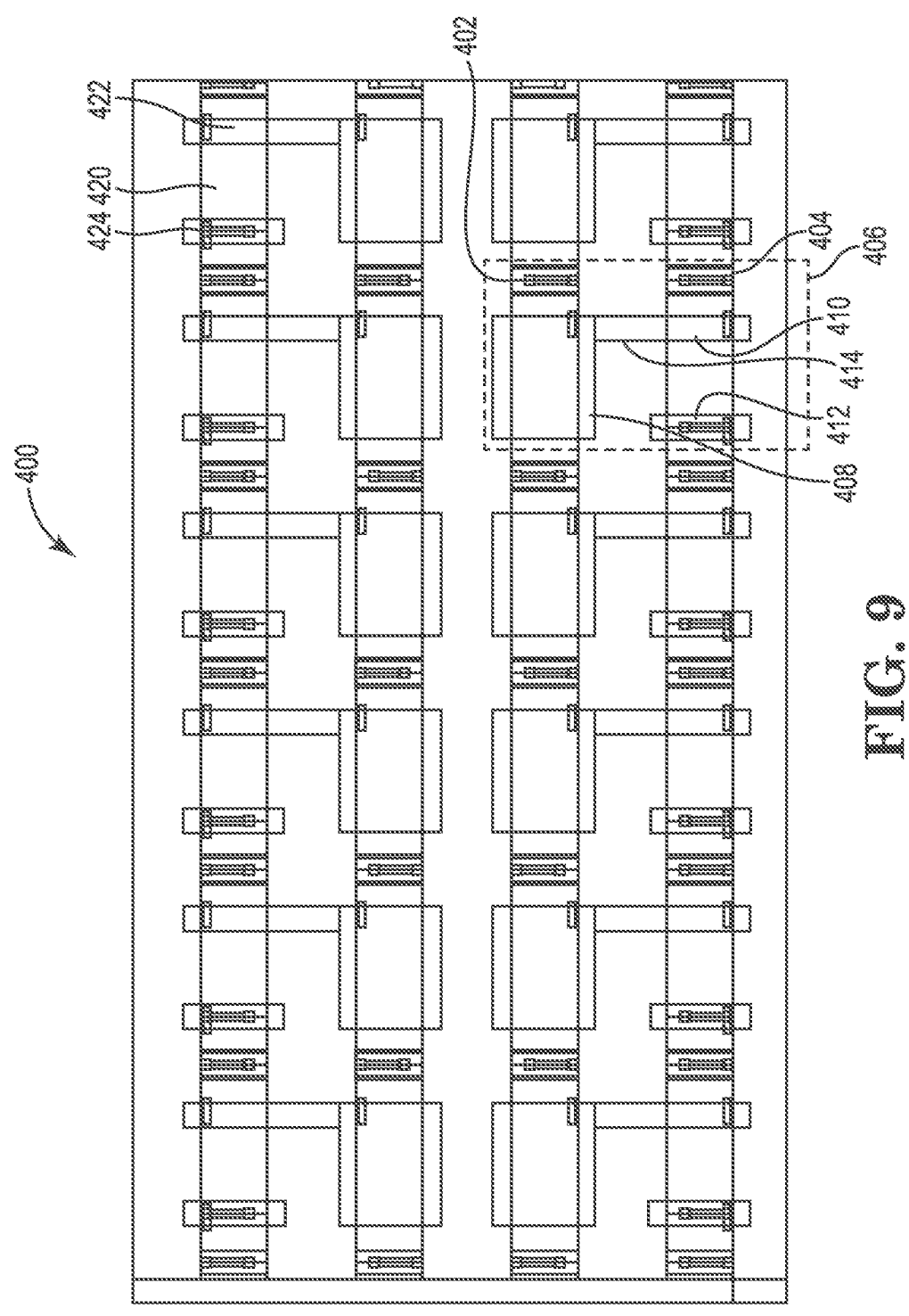
FIG. 9 is schematic layout diagram of an array of logic NVM cells according to an embodiment.

FIG. 9 is schematic layout diagram of the array of logic NVM cells 400, according to an embodiment. Array of logic NVM cells 400 includes diffusion/active regions 420, polysilicon 422, and contacts 424. Each memory cell 406 includes a first transistor 408, a second transistor 410, and a third transistor 412. Each first transistor is connected to a data line 404 via a corresponding contact 424, and each third transistor 412 is connected to word line 402 through another corresponding contact 424. In one example, the second transistor 410 may include a width of 152 nm and a length of 58 nm. The first transistor 408 may include a width of 152 nm and a width of 294 nm. The capacitive coupling from the first transistor 408 to the floating gate 414 equals the capacitance of the first transistor 408 divided by the sum of the capacitance of the first transistor 408 and the capacitance of the second transistor 410. Since the gate oxide of the transistors is the same, the capacitance is a function of the area of the transistors. Thus, the capacitive coupling from the first transistor 408 to the floating gate equals 0.835 in this example.

Figure 10A:
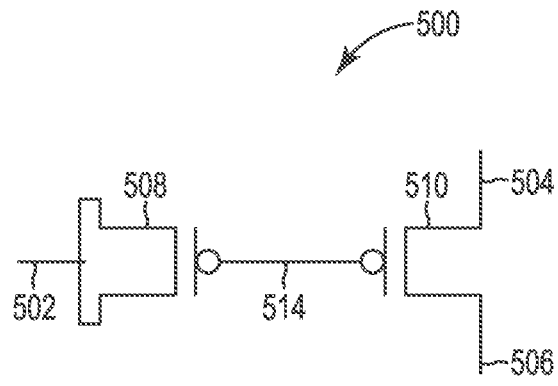
FIGS. 10A and 10B are schematic diagrams of logic NVM cells according to other embodiments.

FIG. 10A is a schematic diagram of a logic NVM cell 500 according to another embodiment. In some embodiments, logic NVM cell 500 may be used in place of each memory cell 406 of the array 400 of logic NVM cells previously described and illustrated with reference to FIG. 8. Logic NVM cell 500 includes a first transistor 508 (e.g., PMOS transistor) and a second transistor 510 (e.g., PMOS transistor). The source and the drain of the first transistor 508 are connected to an access line (e.g., word line) 502, such that the first transistor 508 acts as a capacitor. The gate of the first transistor 508 is directly connected to the gate of the second transistor 510 to form a floating gate as indicated at 514, such that the second transistor 510 acts as a data storage device. One side of the source-drain path of the second transistor 510 is connected to a data line (e.g., bit line) 504, and the other side of the source-drain path of the second transistor 510 is connected to a source line 506.

Logic NVM cell 500 operates similarly to memory cell 406 based on the FN tunneling effect to write data and erase data to and from the memory cell by applying an appropriate electric field to the memory cell to change the threshold voltage of the memory cell. During a program operation of memory cell 500, a program voltage ($V_{PGM}$) might be applied to the word line 502, and a common or ground voltage (e.g., 0V) might be applied to the source line 506 and to the bit line 504. During an erase operation of memory cell 500, a common or ground voltage might be applied to the word line 502, the bit line 504 and the source line 506 might be floated, and the bulk might be biased to an erase voltage ($V_{ERASE}$). During a read operation of memory cell 500, a read voltage ($V_{READ}$) might be applied to the word line 502, a common or ground voltage might be applied to the source line 506, and a bit line voltage ($V_{BL}$) might be applied to the bit line 504.

Figure 10B:
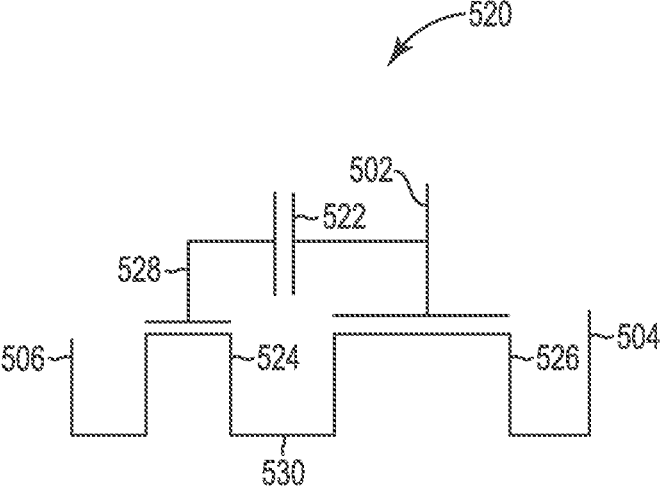

FIG. 10B is a schematic diagram of a logic NVM cell 520 according to another embodiment. In some embodiments, logic NVM cell 520 may be used in place of each memory cell 406 of the array 400 of logic NVM cells previously described and illustrated with reference to FIG. 8. Logic NVM cell 520 includes a capacitor 522, a first transistor 524 (e.g., NMOS transistor), and a second transistor 526 (e.g., NMOS transistor). One side of the source-drain path of the first transistor 524 is connected to a source line 506. The other side of the source-drain path of the first transistor 524 is connected to one side of the source-drain path of the second transistor 526 as indicated at 530. The gate of the first transistor 524 is connected to one side of the capacitor 522 to form a floating gate as indicated at 528, such that the first transistor 524 acts as a data storage device. The other side of the source-drain path of the second transistor 526 is connected to a data line (e.g., bit line) 504. The gate of the second transistor 526 is connected to the other side of the capacitor 522 and an access line (e.g., word line) 502.

Logic NVM cell 520 operates similarly to memory cell 406 based on the FN tunneling effect to write data and erase data to and from the memory cell by applying an appropriate electric field to the memory cell to change the threshold voltage of the memory cell. During a program operation of memory cell 520, a program voltage ($V_{PGM}$) might be applied to the word line 502, and a common or ground voltage (e.g., 0V) might be applied to the source line 506 and to the bit line 504. During an erase operation of memory cell 520, a common or ground voltage might be applied to the word line 502, the bit line 504 and the source line 506 might be floated, and the bulk might be biased to an erase voltage ($V_{ERASE}$). During a read operation of memory cell 520, a read voltage ($V_{READ}$) might be applied to the word line 502, a common or ground voltage might be applied to the source line 506, and a bit line voltage ($V_{BL}$) might be applied to the bit line 504.

While three example logic NVM cells 406, 500, and 520 have been illustrated and described herein, any suitable type of logic NVM cells may be used in the embodiments disclosed herein.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
a first array of Non-Volatile Memory (NVM) cells connected to column decode circuitry and row decode circuitry;
a second array of logic NVM cells storing instructions for accessing the first array of NVM cells and connected to a row driver and a column multiplexer;
a controller configured to execute the instructions stored in the second array of logic NVM cells to perform access operations in the first array of NVM cells;
sense amplifiers connected to the column multiplexer to read data stored in the second array of logic NVM cells; and
program circuits connected to the column multiplexer to write data to the second array of logic NVM cells.

2. The memory device of claim 1, wherein the controller is configured to execute the instructions in response to address signals and control signals from an external host device.

3. The memory device of claim 1, wherein the controller is configured to update the instructions stored in the second array of logic NVM cells.

4. The memory device of claim 1, wherein each memory cell of the second array of logic NVM cells comprises:
a first transistor connected to a word line; and
a second transistor connected to a data line,
wherein a gate of the first transistor is directly connected to a gate of the second transistor to form a floating gate.

5. The memory device of claim 4, wherein each memory cell of the second array of logic NVM cells further comprises:
a third transistor connected to a select line and the second transistor.

6. The memory device of claim 1, wherein the second array of logic NVM cells stores a single instruction in each page of the second array of logic NVM cells.

7. The memory device of claim 1, further comprising:
a timer/sequencer connected to the second array of logic NVM cells and the controller to control a sequence of memory operations and a timing of signals for the second array of logic NVM cells.

8. A memory device comprising:
a first array of Non-Volatile Memory (NVM) cells connected to column decode circuitry and row decode circuitry, each NVM cell of the first array comprising a single transistor;
a second array of logic NVM cells storing instructions for accessing the first array of NVM cells and connected to a row driver and a column multiplexer, each logic NVM cell of the second array comprising at least two transistors;
a controller configured to execute the instructions stored in the second array of logic NVM cells to perform access operations in the first array of NVM cells;
sense amplifiers connected to the column multiplexer to read data stored in the second array of logic NVM cells; and
program circuits connected to the column multiplexer to write data to the second array of logic NVM cells.

9. The memory device of claim 1, wherein the second array of NVM cells comprises:
a plurality of groups of memory cells; and

a plurality of data line join switches to selectively connect a respective group of the plurality of groups of memory cells to the column multiplexer.

10. The memory device of claim 1, further comprising:
a digital finite state machine (FSM) configured to control operations of the second array of logic NVM cells.

11. The memory device of claim 1, further comprising:
an analog supply multiplexer to selectively apply voltages to the second array of logic NVM cells to perform access operations in the second array of NVM cells.

12. The memory device of claim 1, wherein the instructions comprise firmware instructions.

13. The memory device of claim 1, wherein the second array of logic NVM cells stores instructions for accessing the first array of NVM cells for read operations, programming operations, and erase operations.

14. The memory device of claim 1, wherein the first array of NVM cells comprises an array of flash memory cells.

15. The memory device of claim 14, wherein the array of flash memory cells comprises an array of NAND memory cells.

16. A memory device comprising:
a first array of Non-Volatile Memory (NVM) cells, each NVM cell of the first array comprising a single transistor;
a second array of logic NVM cells storing instructions for accessing the first array of NVM cells, each logic NVM cell of the second array comprising at least two transistors;

a controller configured to execute the instructions stored in the second array of logic NVM cells to perform access operations in the first array of NVM cells;
sense amplifiers connected to the second array of logic NVM cells to read data stored in the second array of logic NVM cells; and
program circuits connected to the second array of logic NVM cells to write data to the second array of logic NVM cells.

17. The memory device of claim 16, wherein each logic NVM cell of the second array comprises:
a first transistor connected to a word line; and
a second transistor connected to a data line,
wherein a gate of the first transistor is directly connected to a gate of the second transistor to form a floating gate.

18. The memory device of claim 17, wherein each memory cell of the second array of logic NVM cells further comprises:
a third transistor connected to a select line and the second transistor.

19. The memory device of claim 18, wherein the first array of NVM cells comprises an array of NAND memory cells.

20. The memory device of claim 16, wherein the second array of logic NVM cells stores instructions for accessing the first array of NVM cells for read operations, programming operations, and erase operations.

* * * * *